(12) United States Patent
de Souza et al.

(10) Patent No.: US 7,785,939 B2
(45) Date of Patent: Aug. 31, 2010

(54) PLANAR SUBSTRATE WITH SELECTED SEMICONDUCTOR CRYSTAL ORIENTATIONS FORMED BY LOCALIZED AMORPHIZATION AND RECRYSTALLIZATION OF STACKED TEMPLATE LAYERS

(75) Inventors: Joel P. de Souza, Putnam Valley, NY (US); John A. Ott, Greenwood Lake, NY (US); Alexander Reznicek, Mount Kisco, NY (US); Katherine L. Saenger, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 342 days.

(21) Appl. No.: 11/566,579

(22) Filed: Dec. 4, 2006

(65) Prior Publication Data
US 2008/0108184 A1 May 8, 2008

Related U.S. Application Data

(62) Division of application No. 10/725,850, filed on Dec. 2, 2003, now abandoned.

(51) Int. Cl.
*H01L 21/00* (2006.01)
(52) U.S. Cl. ............... 438/150; 438/486; 257/E29.004
(58) Field of Classification Search ........... 257/527, 257/396, 397, 401, 513, 520; 438/412, 479, 438/257
See application file for complete search history.

(56) References Cited

U.S. PATENT DOCUMENTS

| | | | |
|---|---|---|---|
| 4,385,937 A | | 5/1983 | Ohmura |
| 4,659,392 A | * | 4/1987 | Vasudev ............... 438/412 |
| 4,764,796 A | * | 8/1988 | Sasaki et al. ............... 257/194 |
| 4,768,076 A | | 8/1988 | Aoki et al. |
| 4,775,641 A | * | 10/1988 | Duffy et al. ............... 117/8 |
| 4,816,893 A | | 3/1989 | Mayer et al. |
| 4,863,877 A | * | 9/1989 | Fan et al. ............... 438/492 |
| 4,933,298 A | | 6/1990 | Hasegawa |
| 5,374,564 A | | 12/1994 | Bruel |

(Continued)

FOREIGN PATENT DOCUMENTS

EP 0331811 9/1989

(Continued)

OTHER PUBLICATIONS

Csepregi, L. et al., "Substrate-Orientation Dependence of the Epitaxial Regrowth Rate From SI-Implanted Amorphous Si," J. Appl. Phys., Jul. 1978, 3906-3911, 49:7.

(Continued)

*Primary Examiner*—Thanh V Pham
*Assistant Examiner*—Mark A Laurenzi, III
(74) *Attorney, Agent, or Firm*—Scully, Scott, Murphy & Presser, P.C.; Louis J. Percello, Esq.

(57) ABSTRACT

A method utilizing localized amorphization and recrystallization of stacked template layers is provided for making a planar substrate having semiconductor layers of different crystallographic orientations. Also provided are hybrid-orientation semiconductor substrate structures built with the methods of the invention, as well as such structures integrated with various CMOS circuits comprising at least two semiconductor devices disposed on different surface orientations for enhanced device performance.

21 Claims, 12 Drawing Sheets

U.S. PATENT DOCUMENTS

| | | | |
|---|---|---|---|
| 5,384,473 | A | 1/1995 | Yoshikawa et al. |
| 5,554,562 | A * | 9/1996 | Chang et al. ............... 438/400 |
| 5,582,640 | A * | 12/1996 | Okada et al. ................ 117/8 |
| 5,882,987 | A | 3/1999 | Srikrishnan |
| 6,172,381 | B1 | 1/2001 | Gardner et al. |
| 6,229,187 | B1 * | 5/2001 | Ju ............................ 257/396 |
| 6,518,147 | B1 * | 2/2003 | Villa et al. ................ 438/429 |
| 6,774,390 | B2 | 8/2004 | Sugiyama et al. |
| 6,815,278 | B1 | 11/2004 | Ieong et al. |
| 7,023,055 | B2 | 4/2006 | Ieong et al. |
| 7,329,923 | B2 | 2/2008 | Doris et al. |
| 2004/0195646 | A1 * | 10/2004 | Yeo et al. .................. 257/527 |
| 2004/0256700 | A1 | 12/2004 | Doris et al. |
| 2005/0093104 | A1 | 5/2005 | Ieong et al. |
| 2005/0116290 | A1 | 6/2005 | de Souza et al. |

FOREIGN PATENT DOCUMENTS

| | | |
|---|---|---|
| EP | 0535681 | 4/1993 |
| EP | 1174928 A1 | 1/2002 |
| EP | 1191479 A1 | 3/2002 |
| JP | 60154548 | 8/1985 |
| JP | 1162362 | 6/1989 |
| WO | 2005057631 A2 | 6/2005 |

OTHER PUBLICATIONS

McCann, P. et al., "An Investigation Into Interfacial Oxide in Direct Silicon Bonding," 6th International Symposium on Semiconductor Wafer Bonding, Sep. 2-7, 2001, San Francisco.

Skaguchi et al., "SOI wafers based on epitaxial technology," Solid State Technology, ELTRAN Business Center, Canon Inc., Hiratsuka, Kanagawa Japan, available at http://sst.pennnet.com/articles/article_display.cfm?Section=ARCHI&C=Feat&ARTICLE_ID=75323&KEYWORDS=K%2E%20 Sakaguchi &p=5.

* cited by examiner

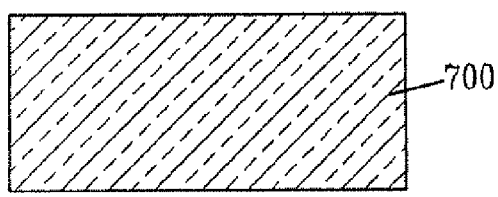
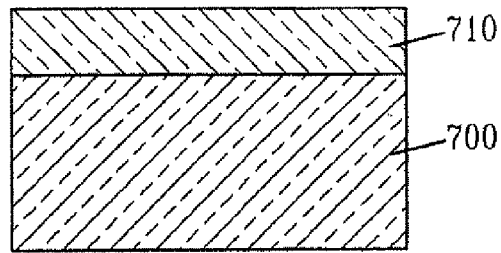
FIG.8A  FIG.8B
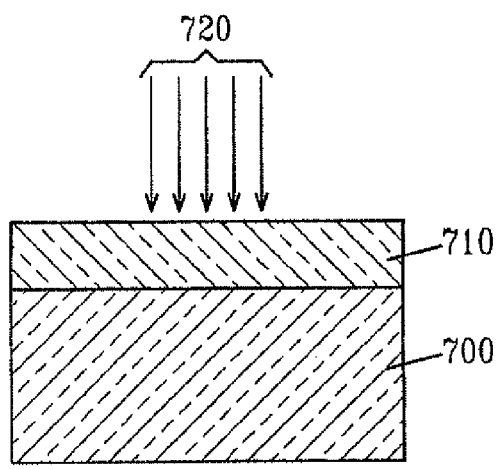
FIG.8C
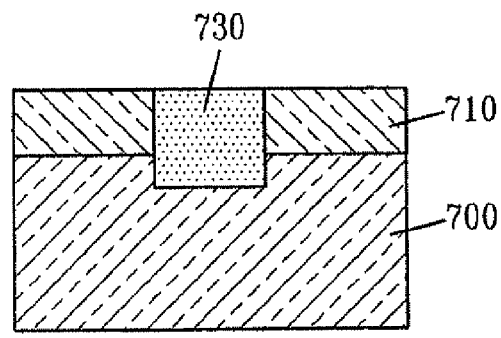
FIG.8D

PLANAR SUBSTRATE WITH SELECTED SEMICONDUCTOR CRYSTAL ORIENTATIONS FORMED BY LOCALIZED AMORPHIZATION AND RECRYSTALLIZATION OF STACKED TEMPLATE LAYERS

RELATED APPLICATIONS

This application is a divisional of U.S. application Ser. No. 10/725,850, filed Dec. 2, 2003.

FIELD OF THE INVENTION

The present invention relates to high-performance complementary metal oxide semiconductor (CMOS) circuits in which carrier mobility is enhanced by utilizing different semiconductor surface orientations for p-type field effect transistors (FETs) and n-type FETs. More particularly, the present invention relates to methods for fabricating planar substrate structures with different surface crystal orientations, and to the hybrid-orientation substrate structures produced by such methods.

BACKGROUND OF THE INVENTION

The CMOS circuits of current semiconductor technology comprise n-type FETs (nFETs), which utilize electron carriers for their operation, and p-type FETs (pFETs), which utilize hole carriers for their operation. CMOS circuits are typically fabricated on semiconductor wafers having a single crystal orientation. In particular, most of today's semiconductor devices are built on Si having a (100) surface orientation.

It is known that electrons have a high mobility in Si with a (100) surface orientation and that holes have high mobility in Si with a (110) surface orientation. In fact, hole mobility can be about 2 to 4 times higher on a 110-oriented Si wafer than on a standard 100-oriented Si wafer. It would therefore be desirable to create a hybrid-orientation substrate comprising 100-oriented Si (where nFETs would be formed) and 110-oriented Si (where pFETs would be formed).

Planar hybrid substrate structures with different surface orientations have been described previously (see, for example, co-assigned U.S. application Ser. No. 10/696,634, filed Oct. 29, 2003, and co-assigned U.S. application Ser. No. 10/250,241, filed Jun. 17, 2003).

FIGS. 1A-1E show, in cross section view, some prior art examples of planar hybrid-orientation semiconductor substrate structures comprising bulk semiconductor substrate 10, dielectric trench isolation regions 20, semiconductor regions 30 with a first surface orientation (e.g., j'k'l'), and semiconductor region 40 with a second surface orientation (e.g., jkl). In the structure of FIG. 1A, semiconductor regions 30 and 40 are both directly on bulk substrate 10, with semiconductor region 40 and bulk substrate 10 having the same orientation. The structure of FIG. 1B differs from that of FIG. 1A only in that semiconductor regions 30 are on buried oxide (BOX) layer 50 instead of directly on bulk substrate 10. The structures of FIGS. 1C-1E differ from those of FIGS. 1A-1B by the thickness of BOX layers 50 and 50' and by the depth of trench isolation structures 20 and 20'.

FIGS. 2A-2B show, in cross section view, previous examples of how integrated CMOS circuits comprising at least one pFET on a (110) crystallographic plane of Si and at least one NFET on a (100) crystallographic plane of Si may be advantageously disposed on the hybrid-orientation substrate structure of FIG. 1B. In FIG. 2A, a bulk Si substrate 120 with 100 orientation has regions 130 of 110-oriented Si on BOX layer 140, and regions 150 of regrown 100-oriented Si on bulk substrate 120. pFET devices 170 are disposed on 110-oriented regions 130 and nFET devices 180 are disposed on 100-oriented regions 150. In FIG. 2B, a bulk Si substrate 180 with 110 orientation has regions 190 of 100-oriented Si on a BOX layer 140 and regions 200 of regrown 110-oriented Si on bulk substrate 180. pFET devices 210 are disposed on 110-oriented regions 180 and nFEET devices 220 are disposed on 100-oriented regions 190.

FIGS. 3A-3I show, in cross section view, the steps of a prior art method used to form the structure of FIG. 1B. Specifically, FIG. 3A shows the starting Si substrate 250, and FIG. 3B shows substrate 250 after formation of BOX layer 260 and silicon-on-insulator (SiOI) device layer 270. Si substrate 250 may be 110- (or 100-) oriented, and SiOI device layer 270 would be 100- (or 110-) oriented. SiOI layer 270 may be formed by bonding or other methods. After depositing protective dielectric (preferably $SiN_x$) layer 280 to form the structure of FIG. 3C, SiOI device layer 270 and BOX layer 260 are removed in selected areas to form openings 290 extending to Si substrate 250, as shown in FIG. 3D. Openings 290 are lined with a dielectric (preferably $SiN_x$) which is then etched to form sidewall spacers 300, as shown in FIG. 3E. Next, epitaxial Si 310 is selectively grown in openings 290 to produce the structure of FIG. 3F, which is planarized back to form the structure of FIG. 3G. Protective dielectric 280 is then removed by a process such as polishing to form the structure of FIG. 3H with coplanar, differently oriented Si device layers 310 (on bulk Si substrate 250) and 320 (on BOX layer 260). FIG. 3I shows the completed substrate structure after shallow trench isolation areas 330 have been formed in the structure of FIG. 3H.

However, for many applications, it would be desirable to have both of the differently oriented Si regions on a BOX. Such structures are possible, but not easy, to produce by variations of the method of FIGS. 3A-3I. For example, the structure of FIG. 4 may be produced by replacing Si substrate 250 in FIG. 3A with a SiOI substrate 400 comprising substrate 410, BOX layer 420, and Si layer 430 to produce differently oriented single crystal regions 320 with a first orientation and 440 with a second orientation matching that of semiconductor layer 430. However, the use of two BOX layers adds extra complexity to the process and produces structures where one of the hybrid orientations is significantly thicker than the other (a disadvantage when both layers need to be thin). In addition, selective epitaxial Si growth can be tricky; defects are likely to nucleate on the sides of sidewall spacers 300 (shown in FIGS. 3E-3F), especially when openings 290 are small (e.g., less than 500 nm in diameter).

In view of the above, it would be desirable to have simpler and better methods (i.e., those that do not require epitaxial regrowth) to form planar hybrid-orientation semiconductor substrate structures, especially planar hybrid-orientation semiconductor-on-insulator (SOI) substrate structures wherein the differently oriented semiconductors are disposed on a common BOX layer.

In addition, it would be desirable to have integrated electrical circuits on such planar hybrid-orientation SOI substrates wherein the electrical circuits comprise pFETs on a (110) crystallographic plane and nFETs on a (100) crystallographic plane.

SUMMARY OF THE INVENTION

It is therefore an object of the present invention to provide a planar hybrid-orientation SOI substrate structure with a surface comprising at least two clearly defined single-crystal semiconductor regions with different surface orientations, wherein the differently oriented semiconductor regions are disposed on a common BOX layer. The term "clearly defined" is used herein to denote that the surface regions of a given surface orientation are macroscopic and not merely single grains of polycrystalline Si.

It is a related object of the present invention to provide methods for fabricating such a planar hybrid-orientation semiconductor substrate structure.

It is a further object of the present invention to provide methods for fabricating similar hybrid-orientation semiconductor substrate structures on a variety of support layers.

It is yet another object of the present invention to provide integrated circuits (ICs) on the hybrid-orientation substrates of the present invention, wherein the ICs comprise pFETs on a (110) crystallographic plane and nFETs on a (100) crystallographic plane.

In accordance with the above listed and other objects, new methods are provided for forming a variety of planar hybrid-orientation semiconductor substrate structures. Common to all methods are three basic steps, by which the orientation of selected semiconductor regions may be changed from an original orientation to a desired orientation:

forming a bilayer template layer stack comprising a first, lower single crystal semiconductor layer (or substrate) having a first orientation and a second, upper (typically bonded) single crystal semiconductor layer having a second orientation different from the first;

amorphizing one of the layers of the bilayer template stack in selected areas (by ion implantation through a mask, for example) to form localized amorphized regions; and recrystallizing the localized amorphized regions using the non-amorphized layer of the stack as a template, thereby changing the orientation in the localized amorphized regions from an original orientation to a desired orientation.

To minimize the possibility of lateral templating, the sides of the regions selected for amorphization and templated recrystallization would typically be isolated from adjacent crystalline regions, for example, by trenches. The trenches may be formed and filled before amorphization, formed and filled between amorphization and recrystallization, or formed after amorphization and filled after recrystallization.

In one embodiment of the present invention, the basic steps above are incorporated into a method for forming a planar hybrid-orientation SiOI substrate structure. A 100-oriented Si substrate is used for the first, lower layer of the bilayer template stack and a 110-oriented Si layer for the second, upper layer of the bilayer template stack. The uppermost portion of the template stack is amorphized in selected areas to a depth that ends in the underlying 100-oriented Si substrate. The amorphized Si regions are then recrystallized into 100-oriented Si, using the underlying 100-oriented Si as a template. Following these steps of patterned amorphization and recrystallization, which leave surface regions of 100-oriented Si in the treated areas and surface regions of 110-oriented Si in the untreated areas, a buried oxide (BOX) layer is formed by oxygen implantation and annealing (e.g., a "Separation by Implantation of Oxygen" or SIMOX process).

In another embodiment of the present invention, the basic steps above are incorporated into a another method to form a planar hybrid-orientation SiOI substrate structure. In this method, a 110-oriented SiOI layer on a BOX layer is used for the first, lower layer of a bilayer template stack, and a 100-oriented Si layer is used for the second, upper layer of a bilayer template stack. The lowermost portion of the bilayer template stack is then amorphized in selected areas from the BOX layer up to a depth ending in the upper template layer. The amorphized Si regions are then recrystallized into 100-orientated Si, using the upper 100-oriented Si layer as a template. The uppermost portion of the bilayer template is then removed by a process such as polishing to leave coplanar surface regions of 110-oriented Si (in the untreated areas) and 100-oriented Si (in the treated areas).

The basic steps of the present invention can be easily adapted in whole or in part to form planar hybrid-orientation semiconductor structures on different substrates (e.g., bulk, thin or thick BOX, insulating or high resistivity substrates), or to form planar hybrid-orientation semiconductor substrate structures having three or more surface orientations.

Yet another aspect of the present invention provides integrated circuits on the planar hybrid-orientation semiconductor substrates of this invention, wherein the integrated circuits comprise pFETs on a (110) crystallographic plane and nFETs on a (100) crystallographic plane.

BRIEF DESCRIPTION OF THE DRAWINGS

These and other features, aspects, and advantages will be more readily apparent and better understood from the following detailed description of the invention, in which:

FIGS. 8A-8G show, in cross section view, a first preferred method to produce the structure of FIG. 5A of the present invention;

DETAILED DESCRIPTION OF THE INVENTION

Figure 1A:
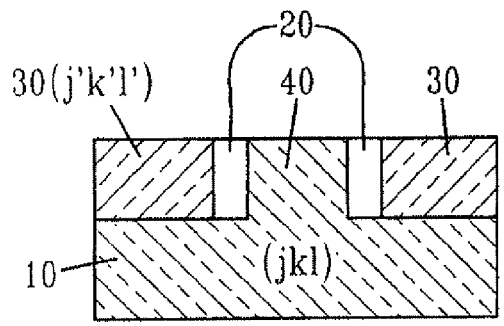
FIGS. 1A-1E show, in cross section view, some examples of prior art planar hybrid-orientation semiconductor substrate structures, wherein the first of two semiconductor orientations is disposed directly on a bulk semiconductor substrate and the second of two semiconductor orientations is disposed either on the substrate (FIGS. 1A and 1C), partially insulated from the substrate by a thin BOX layer (FIG. 1E), or fully insulated from the substrate by a thick BOX layer (FIGS. 1B and 1D)
Figure 1B:
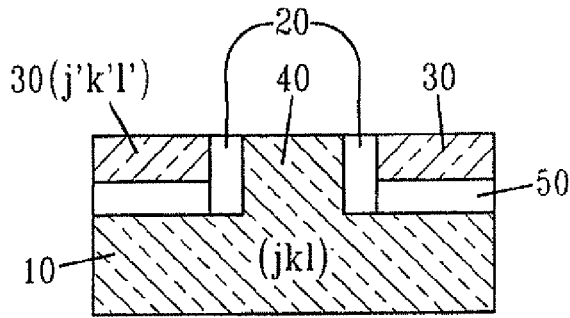
Figure 1C:
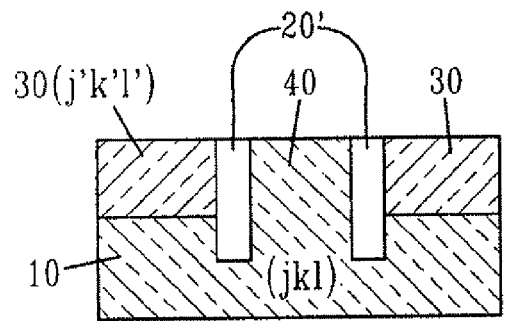
Figure 1D:
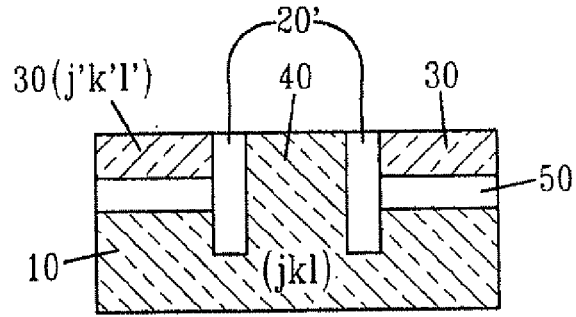
Figure 1E:
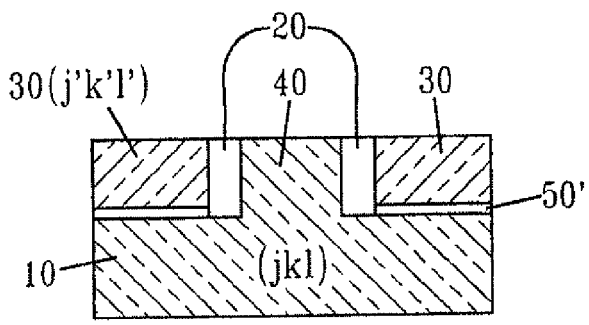
Figure 2A:
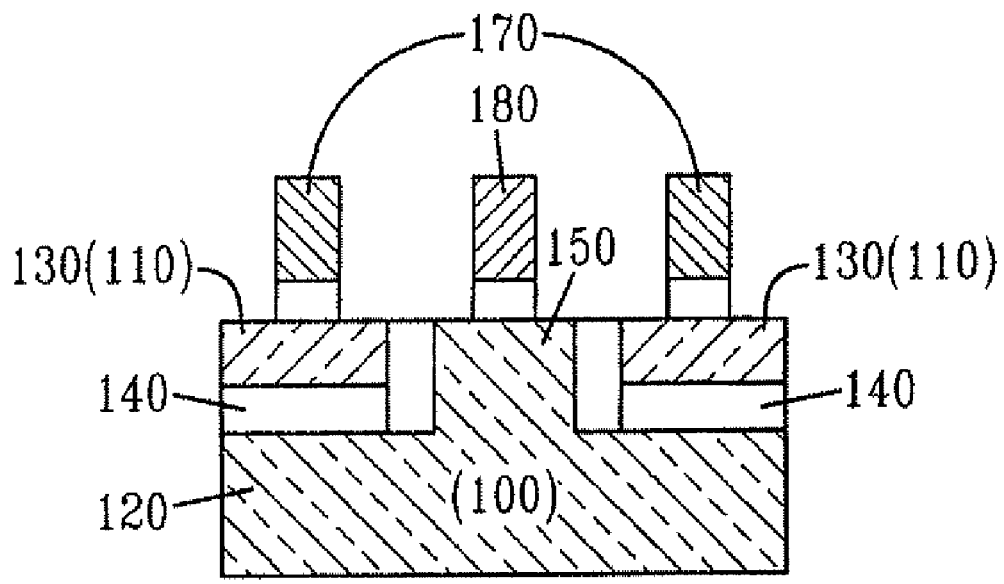
FIGS. 2A-2B show, in cross section view, prior art examples of how the hybrid-orientation substrate structure of FIG. 1B might form the basis of integrated circuits comprising at least one pFET on a 110-oriented single crystal Si region and at least one NFET on a 100-oriented single crystal Si region.
Figure 2B:
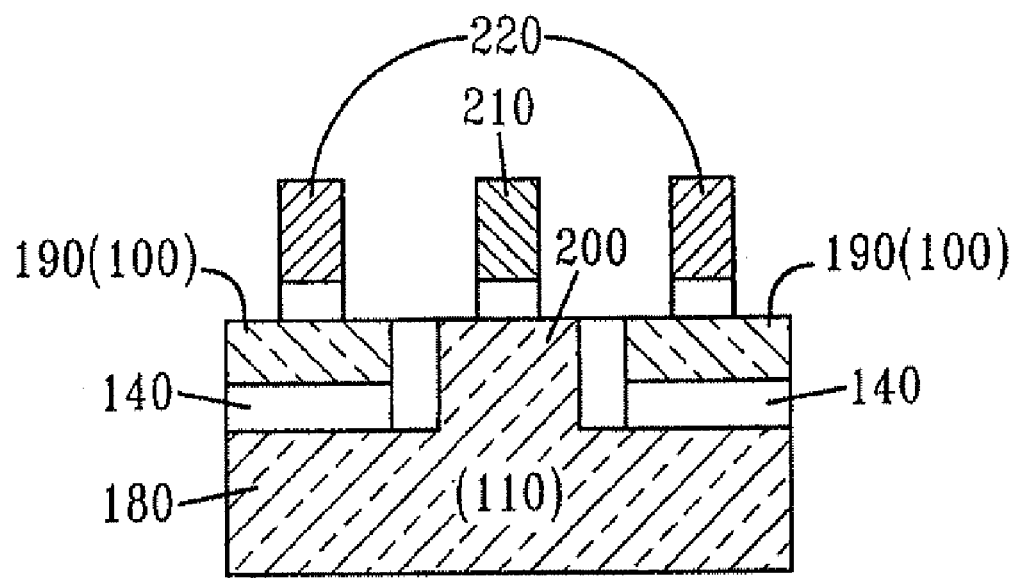
Figure 3A:
FIGS. 3A-3I show, in cross section view, the steps of the basic prior art method used to form the structures of FIGS. 1A-1E, illustrated for the case of FIG. 1B.
Figure 3B:
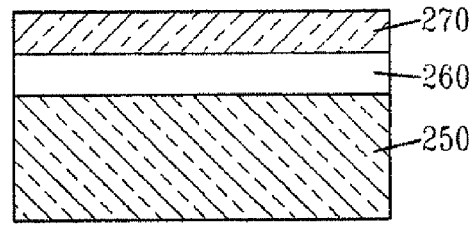
Figure 3C:
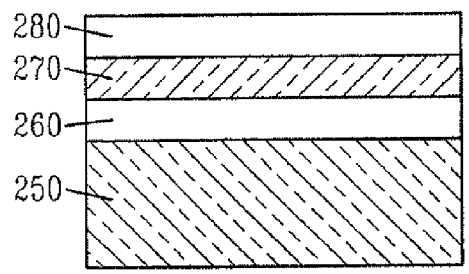
Figure 3D:
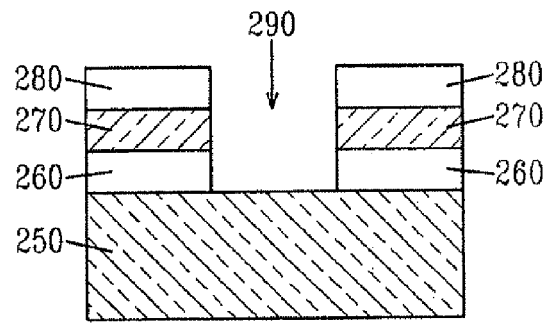
Figure 3E:
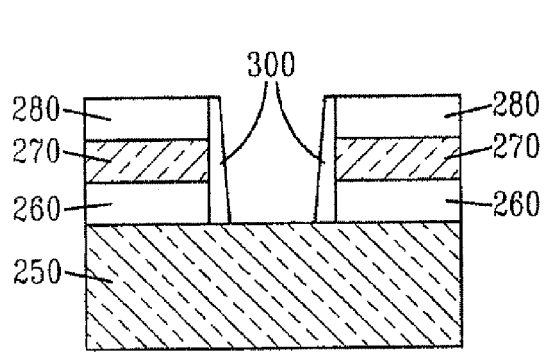
Figure 3F:
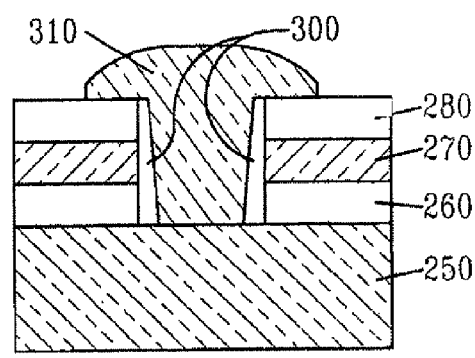
Figure 3G:
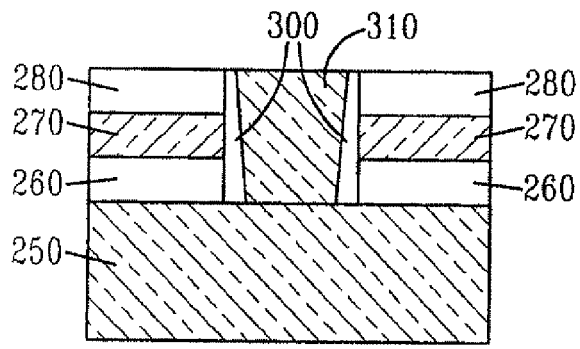
Figure 3H:
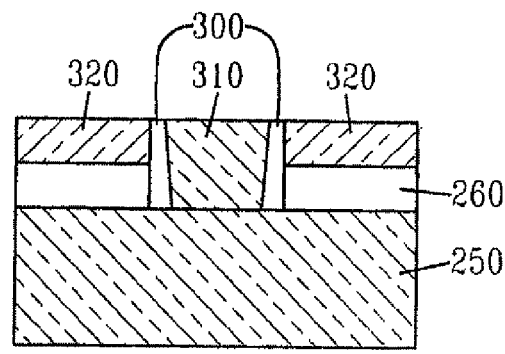
Figure 3I:
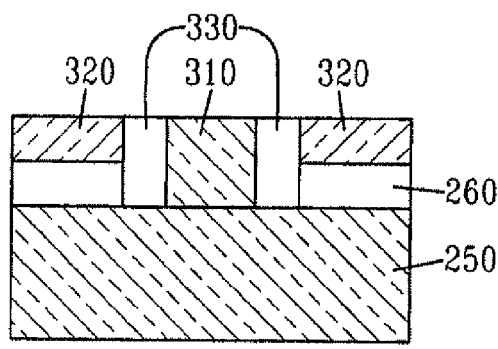
Figure 4:
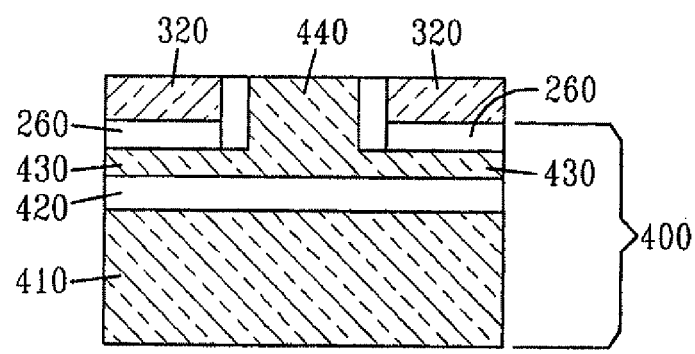
FIG. 4 shows, in cross section view, a prior art example of a planar hybrid-orientation semiconductor substrate structure wherein both of two differently oriented single crystal Si regions are disposed on buried insulator layers.

The present invention, which provides planar hybrid-orientation SOI substrate structures and methods of fabricating the same, will now be described in greater detail by referring to the drawings that accompany the present application.

Figure 5A:
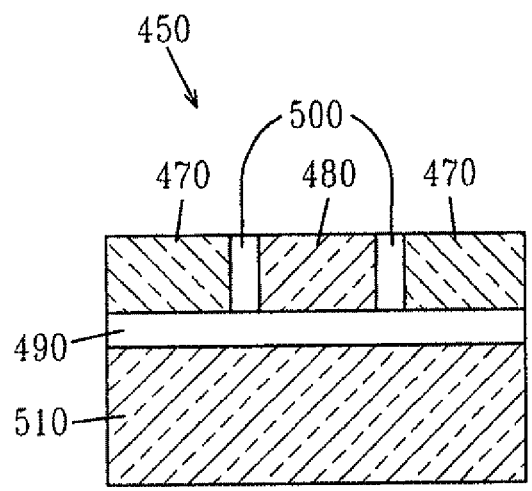
FIGS. 5A-5B show, in cross section view, two preferred SOI embodiments of the hybrid-orientation substrates of the present invention.
Figure 5B:
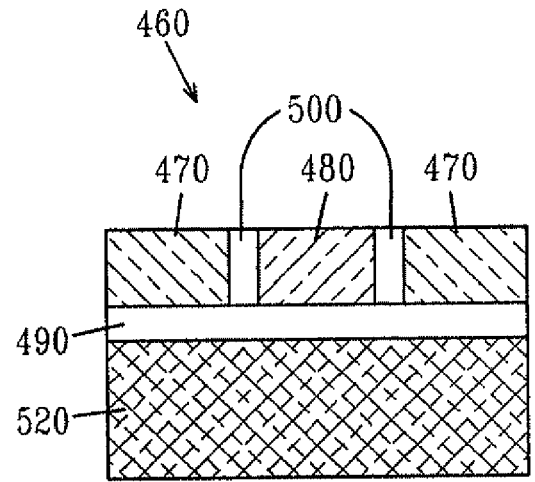

FIGS. 5A-5B show, in cross section view, two preferred embodiments of hybrid-orientation substrates that can be fabricated by the methods of the present invention. Hybrid-orientation substrate 450 of FIG. 5A and hybrid-orientation substrate 460 of FIG. 5B both comprise first single crystal semiconductor regions 470 with a first orientation, and second single crystal semiconductor regions 480 with a second orientation different from the first orientation. Semiconductor regions 470 and 480 have approximately the same thickness and are disposed on the same BOX layer 490. The term "BOX" denotes a buried oxide region. Although this terminology is specifically used here, the present invention is not limited to merely buried oxides. Instead, various insulating layers can be used; the various insulating layers are described in greater detail hereinbelow.

Semiconductor regions 470 and 480 are separated by dielectric trench isolation regions 500, which are shown as having the same depth and stopping on BOX layer 490. However, in some embodiments of the present invention, trench isolation regions 500 may be shallower (so as not to reach BOX layer 490), deeper (so as to extend past BOX layer 490), or of non-equal depths, as desired. The structures of FIGS. 5A and 5B differ from each other only in the particulars of substrates 510 and 520. Substrate 510 in FIG. 5A is a semiconductor having an epitaxial relationship to single crystal semiconductor region 480, whereas substrate 520 in FIG. 5B has no particular restrictions other than being compatible with whatever subsequent processing it will be subjected to.

Figure 6:
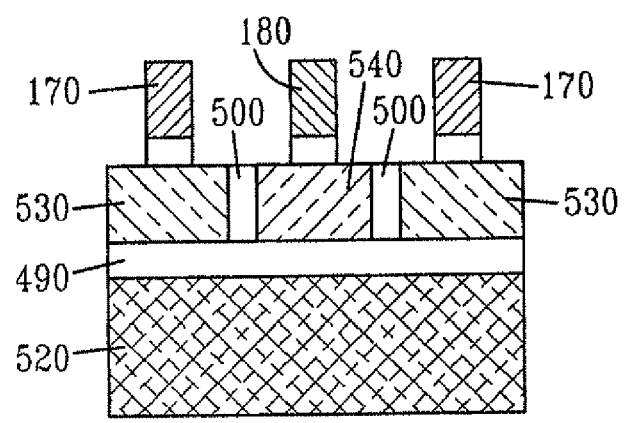
FIG. 6 shows, in cross section view, how a hybrid-orientation substrate structure of the present invention can be used to form the basis of an integrated circuit comprising at least one pFET on a (110) Si crystallographic plane and at least one NFET on a (100) Si crystallographic plane.

The hybrid-orientation substrate structures of FIGS. 5A-5B may be incorporated as the substrates for integrated circuits comprising at least one pFET on a (110) crystallographic plane and at least one nFET on a (100) crystallographic plane. FIG. 6 illustrates an exemplary integrated circuit on a Si version of the hybrid-orientation substrate structure of FIG. 5B, in cross section view. Substrate 520 has single crystal 110-oriented Si regions 530 and single crystal 100-oriented Si regions 540, separated by isolation regions 500 on BOX layer 490. pFET devices 170 are disposed on 110-oriented regions 530 and NFET devices 180 are disposed on 100-oriented regions 540. For clarity, dopings are not shown.

The FETs shown in FIG. 6 can be fabricated on the structure shown in FIG. 5A using techniques that are well known to those skilled in the art. In some embodiments, the 110 and 100 crystal orientations of layers 540 and 530 are reversed. In that embodiment, the pFET devices 170 would still be fabricated atop the 110-oriented regions and the NFET devices 180 would be fabricated atop the 100-oriented surface.

The present invention also provides new methods for forming planar hybrid-orientation semiconductor substrate structures. Common to all methods are three basic steps, by which the orientation of selected semiconductor regions may be changed from an original orientation to a desired orientation:

forming a bilayer template layer stack comprising a first, lower single crystal semiconductor layer (or substrate) having a first orientation and a second, upper (typically bonded) single crystal semiconductor layer having a second orientation different from the first;

amorphizing one of the layers of the bilayer template stack in selected areas (by ion implantation through a mask, for example) to form localized amorphized regions; and recrystallizing the localized amorphized regions using the non-amorphized layer of the stack as a template, thereby changing the orientation in the localized amorphized regions from an original orientation to a desired orientation.

These steps are illustrated in FIGS. 7A-7D for the case of upper layer amorphization and bottom layer templating. Although this embodiment is shown, the present invention also contemplates methods in which the bottom layer is amorphized and recrystallization is templated from the top layer.

Figure 7A:
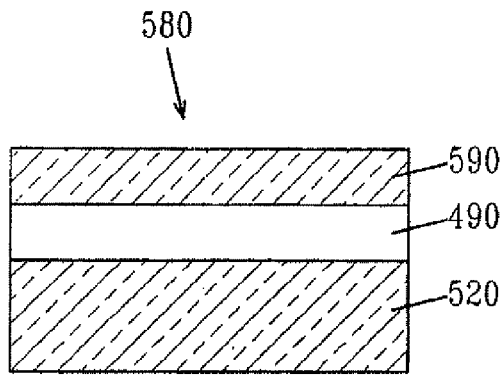
FIGS. 7A-7G show, in cross section view, the basic steps underlying the methods of the present invention, illustrated for the case of upper layer amorphization and lower layer templating.
Figure 7B:
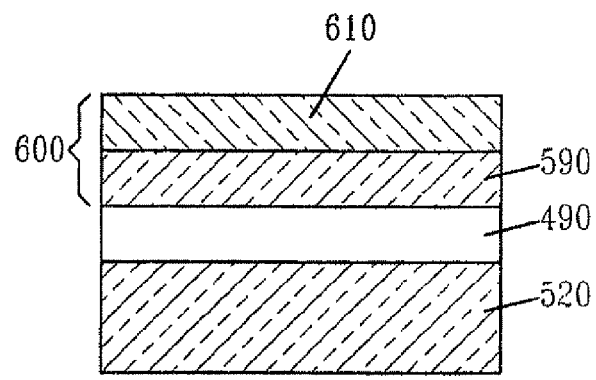
Figure 7C:
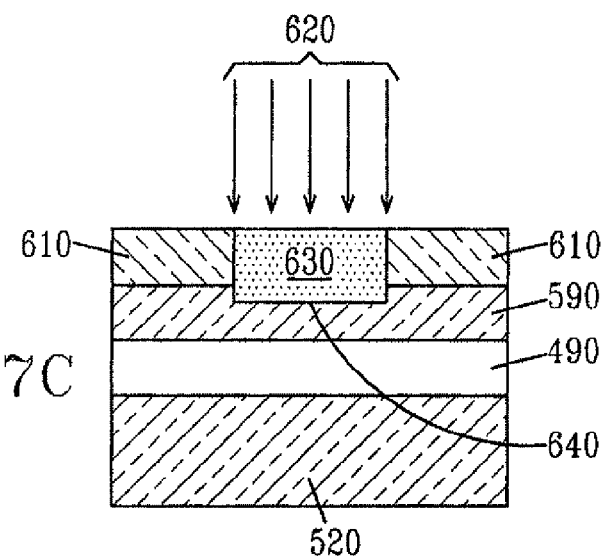
Figure 7D:
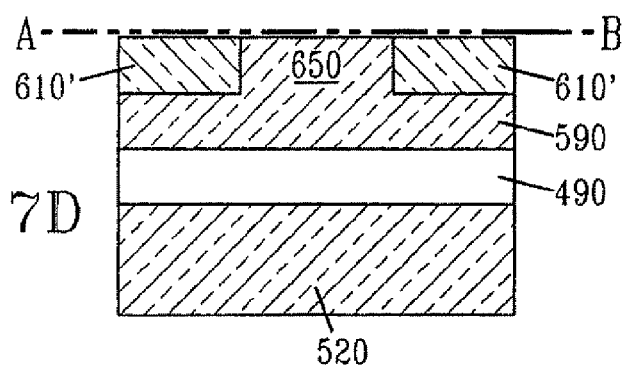

FIG. 7A shows initial SOI substrate 580 comprising base substrate 520, BOX layer 490, and single crystal SOI layer 590 with a first orientation. SOI layer 590 may be formed by bonding or by any other method known to the art. FIG. 7B shows bilayer template stack 600 comprising SOI layer 590 as a lower template layer with a first orientation and single crystal semiconductor layer 610 as an upper template layer with a second orientation different from the first orientation. Layer 610 would typically be formed by bonding. FIG. 7C shows the structure of FIG. 7B after ion bombardment 620 in selected areas creates localized amorphized regions 630. Localized amorphized regions 630 extend from the top surface of upper template layer 610 down to interface 640, located within lower template layer 590. Selected area ion bombardment 620 would typically be effected by blanket ion bombardment in combination with a patterned mask. FIG. 7D shows the structure of FIG. 7C after localized amorphized regions 630 have been recrystallized (starting at interface 640, using lower layer 590 as a template) to form single crystal semiconductor region 650. Non-amorphized upper template layer regions 610' (with the second crystal orientation) and recrystallized region 650 (with the first crystal orientation) now comprise planar hybrid-orientation substrate 650 with surface A-B comprising at least two clearly defined single-crystal semiconductor regions with different surface orientations.

To minimize the possibility of lateral templating, the sides of the region(s) 630 selected for amorphization and templated recrystallization would typically be at least partially isolated from adjacent crystalline regions, for example, by trenches. The trenches may be formed and filled before amorphization, formed and filled between amorphization and recrystallization, or formed after amorphization and filled after recrystallization. Trench formation would typically be effected by a process such as reactive ion etching (RIE) through a mask.

Figure 7E:
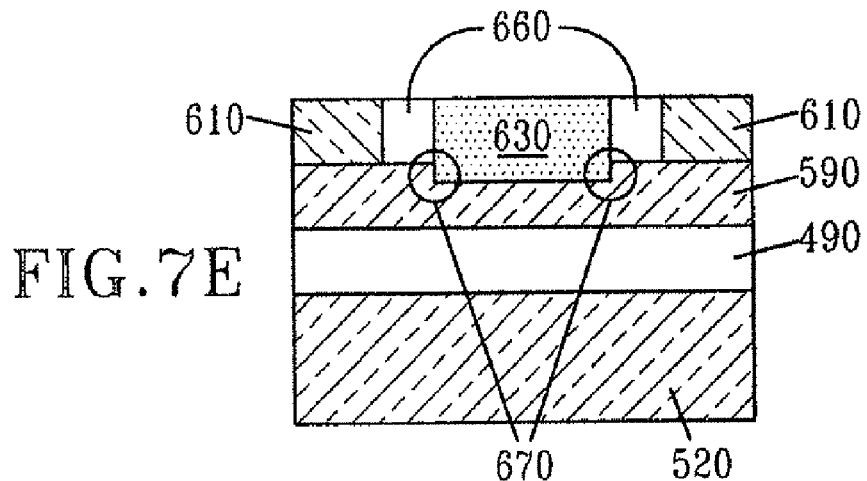
Figure 7F:
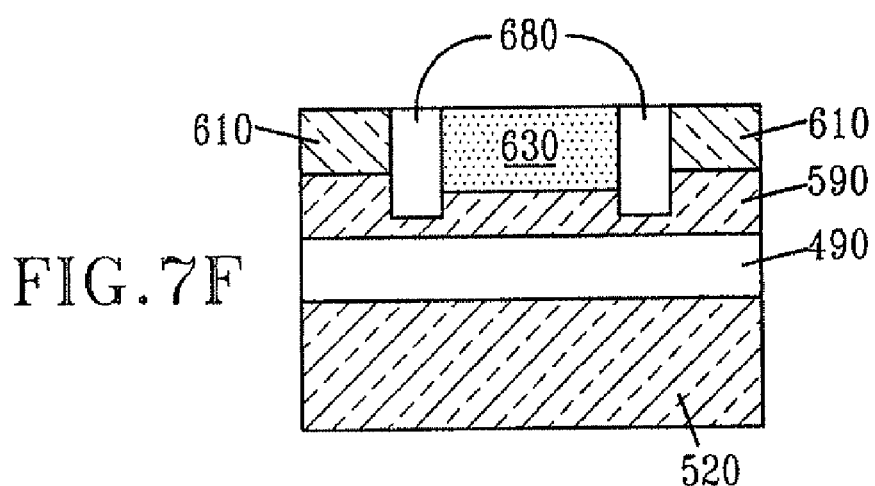
Figure 7G:
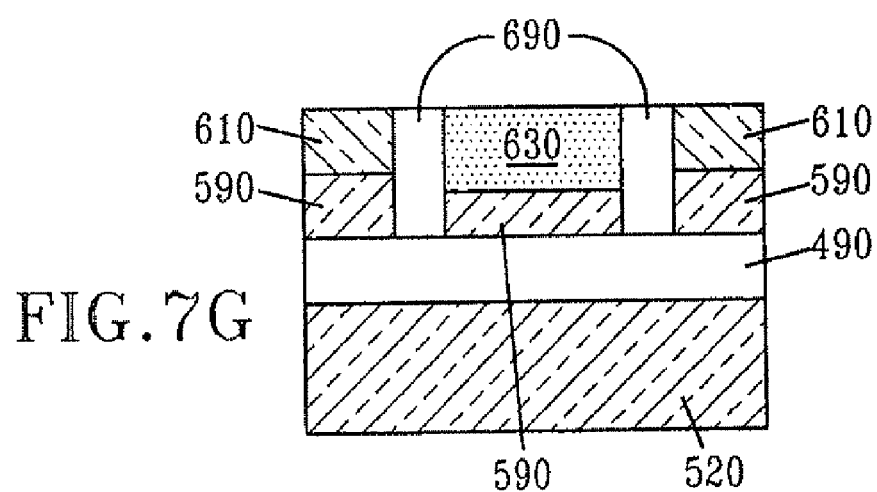

FIGS. 7E-7G show examples of three geometries for isolation trenches. In FIG. 7E, isolation trenches 660 extend through the upper template layer, but do not extend past the amorphization depth. In this case, some templating from side interfaces 670 may occur. In FIG. 7F, isolation trenches 680 extend past the amorphization depth, but not all the way to BOX layer 490, and in FIG. 7G, isolation trenches 690 extend all the way to BOX layer 490. However, isolation trenches may not be necessary if the recrystallization rate of the desired crystal orientation is much faster than recrystallization templated from competing undesired crystal orientations. For example, the recrystallization rates of Si-implant-amorphized single crystal Si samples has been reported to be three times faster for 100-oriented Si than for 110-oriented Si [see, for example, L. Csepregi et al., J. Appl. Phys. 49 3096 (1978)].

The fact that different semiconductor orientations can differ in their recrystallization rates should also be considered when designing the template layer stacks and process flows. The layer of a bilayer template stack having the slower-growing orientation would preferably be the one that is amorphized, whereas the layer with the faster-growing orientation would preferably be the one from which the recrystallization is templated.

Figure 8E:
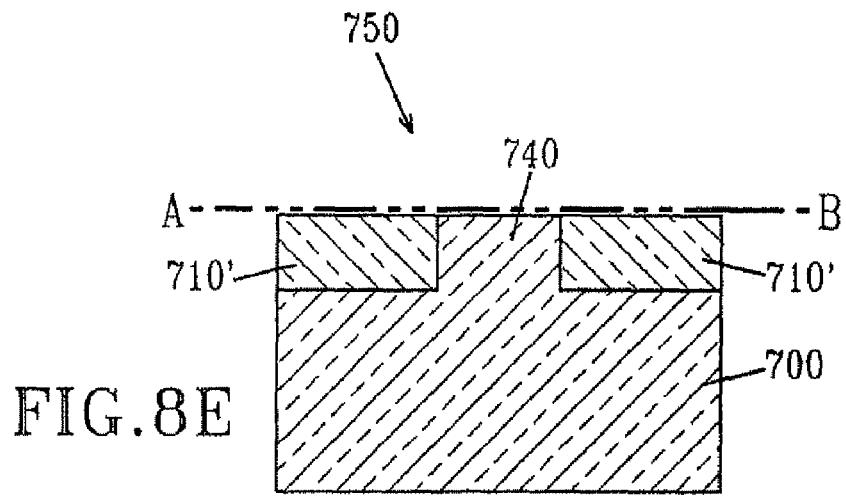

In one embodiment of the invention, shown in FIGS. 8A-8G, the basic steps of FIGS. 7A-7D are incorporated into a method for forming a planar hybrid-orientation SiOI substrate structure similar to structure 450 of FIG. 5A. For simplicity, isolation trenches are not shown. FIG. 8A shows 100-oriented Si substrate 700 comprising the first, lower layer of the template stack; FIG. 8B shows the substrate 700 after addition of 110-oriented Si layer 710 comprising the second, upper layer of the template stack. Layer 710 would typically be formed by bonding.

FIG. 8C shows the structure of FIG. 8B being subjected to ion bombardment 720 in selected areas to create the structure of FIG. 8D with localized amorphized regions 730 extending from the top surface of template layer 710 to a depth ending in substrate 700. FIG. 8E shows the structure of FIG. 8D after localized amorphized regions 730 have been recrystallized (using 100-oriented Si substrate 700 as a template) to form single crystal 100-oriented Si region(s) 740. Non-amorphized 110-oriented Si regions 710' and recrystallized 100-oriented Si region(s) 740 now comprise bulk planar hybrid-orientation substrate 750 with surface A-B comprising at least two clearly defined single-crystal semiconductor regions with different surface orientations.

Figure 8F:
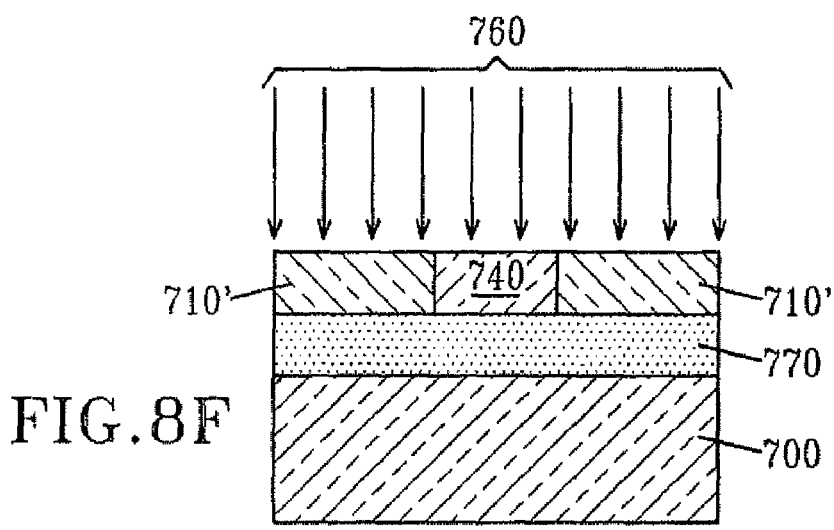
Figure 8G:
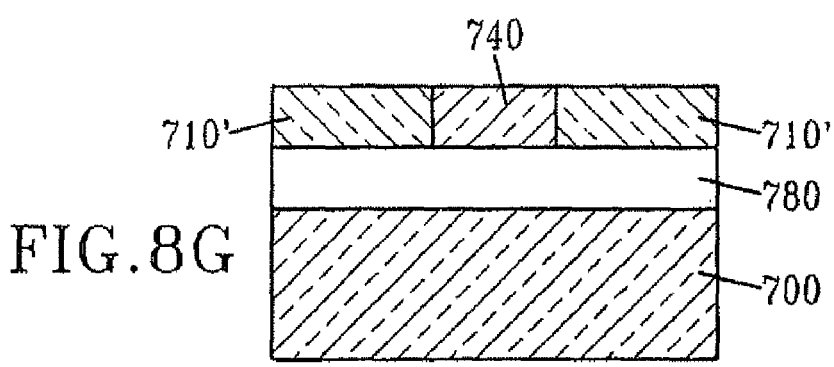

A SIMOX process is then used to create a BOX layer, as shown in FIGS. 8F-8G. FIG. 8F shows the structure of FIG. 8E being exposed to blanket oxygen ion implantation 760 used to create buried O-rich layer 770. O-rich layer 770 preferably contains the original interface between layers 700 and 710, and is converted into BOX layer 780 of FIG. 8G by the appropriate annealing steps.

Figure 9A:
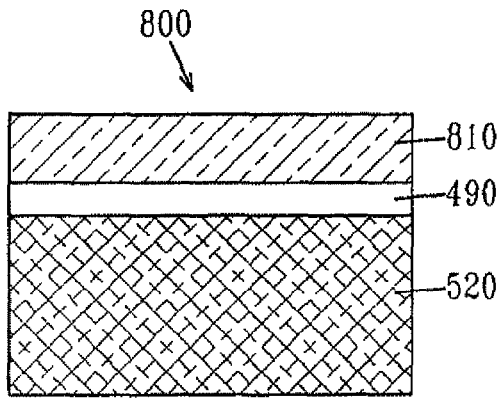
FIG. 9A-9F show, in cross section view, a second preferred method to produce the structure of FIG. 5B of the present invention.
Figure 9B:
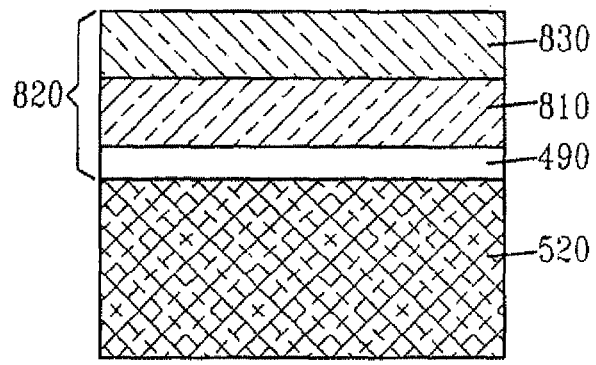
Figure 9C:
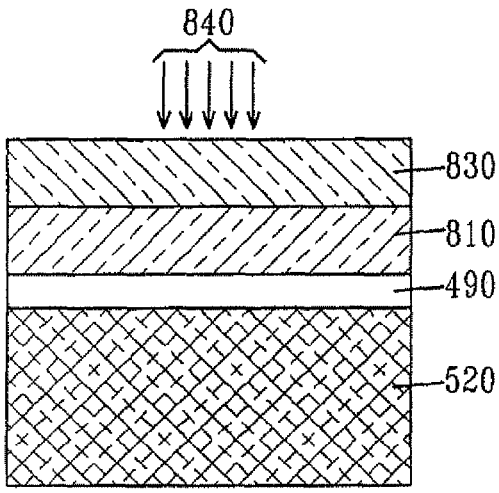
Figure 9D:
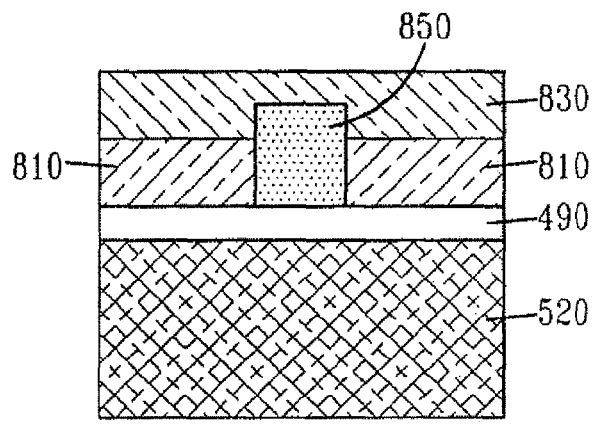
Figure 9E:
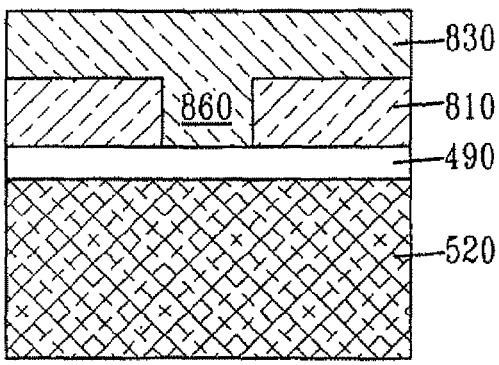
Figure 9F:
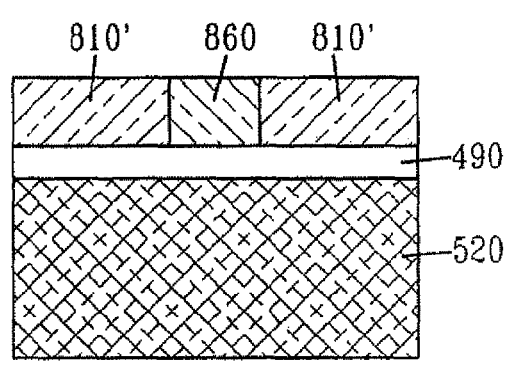

In another embodiment of the present invention, shown in FIGS. 9A-9F, the basic steps of FIGS. 7A-7D are incorporated into yet another method to form a planar hybrid-orientation SiOI substrate structure similar to structure 460 of FIG. 5B. Specifically, FIG. 9A shows initial SiOI substrate 800 comprising base substrate 520, BOX layer 490, and 110-oriented single crystal Si layer 810. Si layer 810 may be formed by bonding or by any other method known to the art. FIG. 9B shows bilayer template stack 820 comprising 110-oriented Si layer 810 as a lower template layer and single crystal 100-oriented Si layer 830 as an upper template layer. Layer 830 would typically be formed by bonding. FIG. 9C shows the structure of FIG. 9B being subjected to ion bombardment 840 in selected areas to create the structure of FIG. 9D with buried localized amorphized regions 850. Localized amorphized regions 850 extend from BOX layer 490 through lower template layer 810 and partially into upper template layer 830. As mentioned above, the areas selected for amorphization and templated recrystallization would typically be isolated from adjacent crystalline regions by trenches (not shown) to minimize the possibility of lateral templating. FIG. 9E shows the structure of FIG. 9D after localized amorphized regions 850 have been recrystallized, using upper template layer 810 as a template, to form 100-oriented single crystal Si regions 860. Upper template layer 810 is then removed by a process such as polishing (or oxidation followed by wet etchback) to leave coplanar 110-oriented single-crystal Si regions 810' and 100-oriented single-crystal Si regions 860 disposed on common BOX layer 490.

It should be noted that the method of FIGS. 8A-8G may equally well be employed with the orientations of substrate 700 and upper template layer 710 reversed, i.e., with substrate 700 comprising a 110-oriented Si wafer instead of a 100-oriented Si wafer, and upper template layer 710 comprising a single crystal layer of 100-oriented Si instead of a single crystal layer of 110-oriented Si. Likewise, the method of FIGS. 9A-9F may be employed with the orientations of lower template layer 810 and upper template layer 830 reversed, i.e., with lower template layer 810 being 100-oriented Si instead of 110-oriented Si and upper template layer 830 being 110-oriented Si instead of 100-oriented Si. More generally, the structures and methods of the present invention may be employed using semiconductors other than Si, as will be described in more detail below.

Figure 10A:
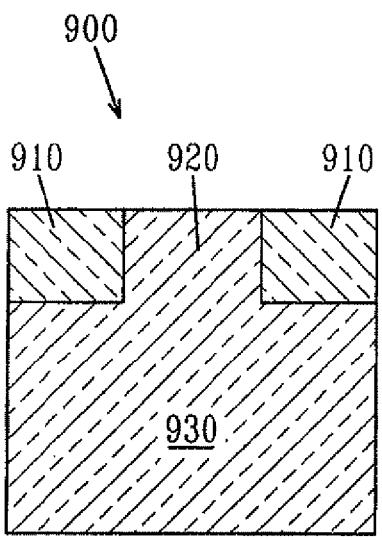
FIGS. 10A-10I show, in cross section view, different embodiments of the hybrid-orientation substrates that may be produced by the methods of the present invention.
Figure 10B:
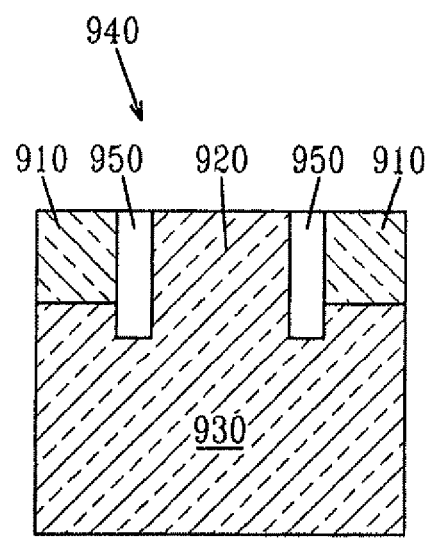

FIGS. 10A-10I show, in cross section view, different embodiments of the hybrid-orientation substrates that may be produced by the methods of the present invention. FIG. 10A shows "bulk" planar hybrid-orientation semiconductor substrate structure 900 comprising first single crystal semiconductor regions 910 with a first orientation, and second single crystal semiconductor regions 920 with a second orientation different from the first orientation, but identical to the orientation of substrate 930. Planar hybrid-orientation semiconductor substrate structure 940 of FIG. 10B is similar to structure 900 of FIG. 10A, but has trench isolation regions 950 separating single crystal semiconductor regions 910 and 920.

Figure 10C:
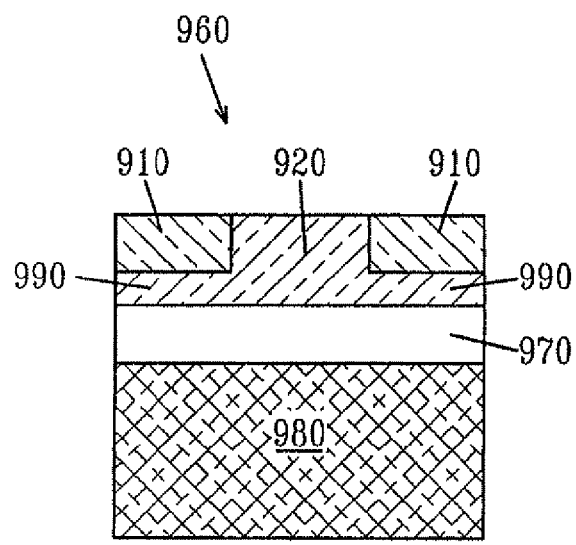
Figure 10D:
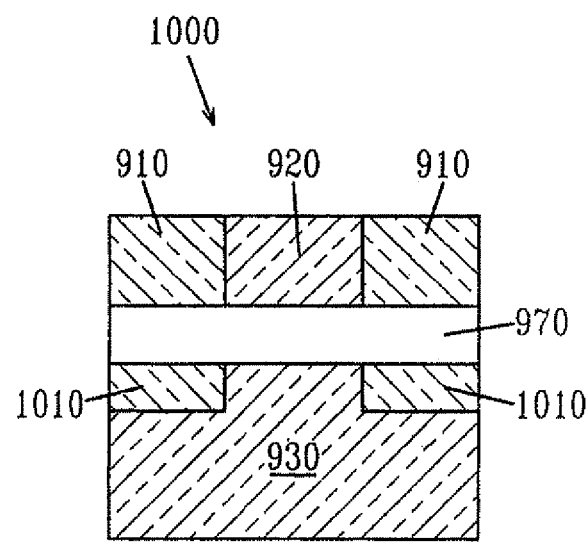

Planar hybrid-orientation semiconductor substrate structure 960 of FIG. 10C is similar to structure 900 of FIG. 10A. However, substrate 930 has been replaced with substrate 980, which may or not be epitaxially related to semiconductor region 920. Structure 960 also comprises BOX layer 970 under semiconductor regions 910 and 920, and residuals 990 of second semiconductor material with the second orientation remaining under first semiconductor regions 910. Planar hybrid-orientation semiconductor substrate structure 1000 of FIG. 10D is similar to structure 960 of FIG. 10C, except that semiconductor region 920 is epitaxial related to semiconductor substrate 930, and BOX layer 970 is located above interface 1010 between first single crystal semiconductor regions 910 and substrate 930.

Figure 10E:
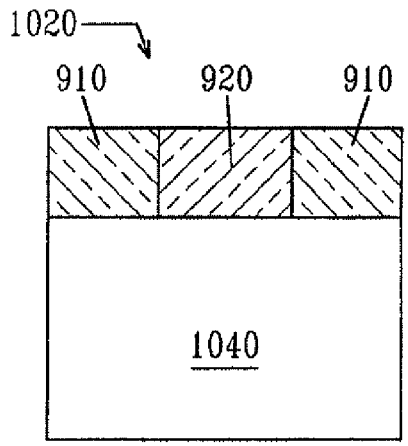
Figure 10F:
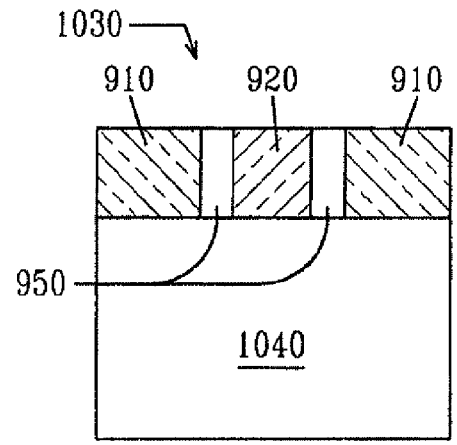

Planar hybrid-orientation semiconductor substrate structures 1020 and 1030 of FIGS. 10E-10F are identical to structures 1000 and 940 of FIGS. 10A-10B, except that semiconductor substrate 930 has been replaced by insulating substrate 1040.

Figure 10G:
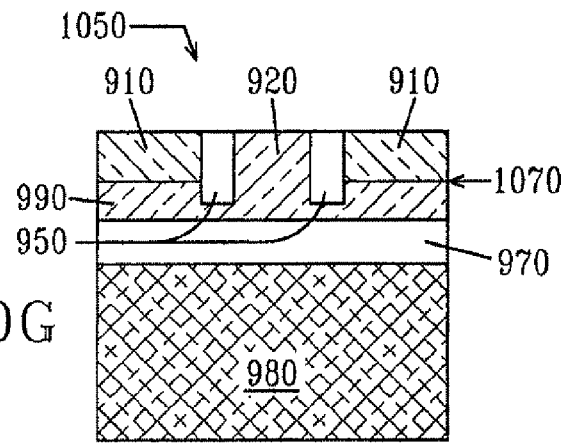
Figure 10H:
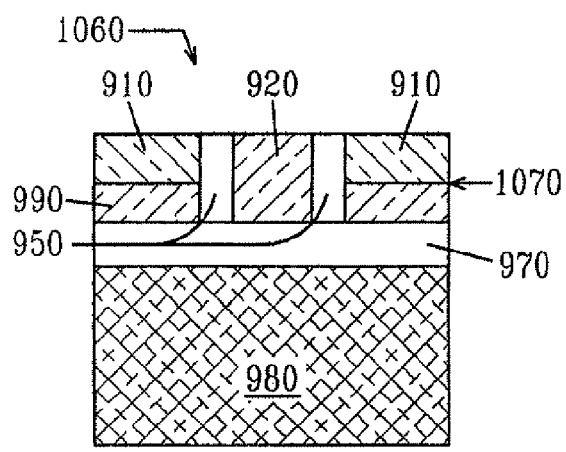

Planar hybrid-orientation semiconductor substrate structures 1050 and 1060 of FIGS. 10G-10H are similar to structure 960 of FIG. 10C, but have trench isolation regions 950. In structure 1050 of FIG. 10G, trench isolation regions 950 extend below interface 1070 between first single crystal semiconductor regions 910 and residuals 990, but do not reach BOX layer 970. In structure 1060 of FIG. 10H, trench isolation regions 950 extend to BOX layer 970.

Figure 10I:
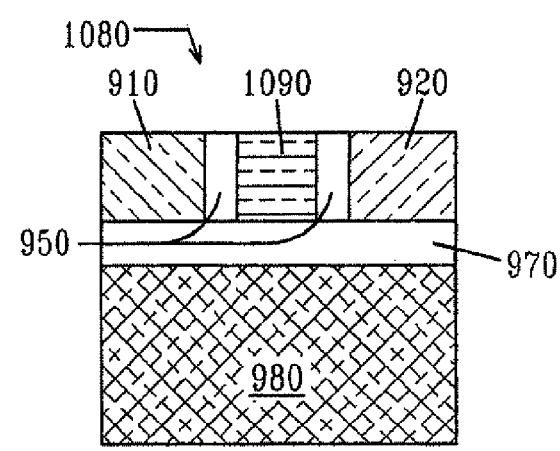

Planar hybrid-orientation semiconductor substrate structure 1080 of FIG. 10I comprises three differently oriented single crystal semiconductor regions 910, 920, and 1090, separated by trench isolation regions 950 extending to BOX layer 970. Planar hybrid-orientation semiconductor substrate structures with three or more surface orientations may be produced by the localized amorphization and recrystallization methods of this invention by using a multilayer template stack instead of a bilayer template stack.

Structures like those of FIGS. 5A-5B and FIGS. 10A-10I may be produced by using various permutations of the basic steps of the invention with or without additional steps. For example, a planar hybrid-orientation structure resembling 460 of FIG. 5B may be produced from the structure of FIG. 10H by the additional steps of amorphizing residuals 990 of second semiconductor material 920 and recrystallizing the amorphized regions using single crystal region 910 as a template.

The semiconductor substrates and single crystal semiconductor regions of the present invention may be selected from a wide range of semiconductor materials. For example, substrates 510, 520, 700, 930 and 980, and differently oriented first and second semiconductor regions 470, 610', 910, and 480, 650, and 920 may be selected from the group including Si, SiC, SiGe, SiGeC, Ge alloys, Ge, C, GaAs, InAs, InP as well as other III-V or II-VI compound semiconductors. Layered combinations or alloys of the aforementioned semiconductor materials (for example, Si layers on SiGe), with or without one or more dopants, are also contemplated herein. First and second semiconductor regions may be strained, unstrained, or a combination of strained and unstrained layers can be used. The crystallographic orientations would typically be selected from the group including (110), (111), and (100).

The thickness of first and second single crystal semiconductor regions 470, 610', 910, and 480, 650, and 920 is typically from about 1 to about 500 nm, with a thickness from about 10 to about 100 nm being more typical. The thickness of substrates 510, 520, 700, 930, and 980 would typically be between 5 and 1000 μm, and most typically be about 600 μm.

BOX layers and insulating substrates 1040 may be selected from a wide range of dielectric materials, including, but not limited to the group including $SiO_2$, crystalline $SiO_2$, $SiO_2$ containing nitrogen or other elements, silicon nitrides, metal oxides (e.g., $Al_2O_3$), insulating metal nitrides (e.g., AlN), highly thermally conductive materials such as crystalline diamond. BOX thicknesses may range from about 2 nm to about 500 nm, with preferable thicknesses typically being in the range from about 50 to about 150 nm.

Bonding methods for forming the template stack may include any methods known to those skilled in the art (see, for example, Q. Y. Tong et al. [in *Semiconductor Wafer Bonding: Science and Technology* (John Wiley, 1998)] and co-pending and co-assigned U.S. application Ser. No. 10/696,634, filed Oct. 29, 2003, and co-pending and co-assigned U.S. application Ser. No. 10/250,241, filed Jun. 17, 2003). The contents of each of the above mentioned co-assigned U.S. Applications are incorporated herein by reference.

Differently oriented semiconductor surfaces to be bonded are preferably hydrophobic (rather than hydrophilic) for the cleanest possible interfaces, since impurities in the amorphized regions will typically impede the progress of the recrystallization. However, very thin oxides at the bonded interface may be tolerable if the oxide can be made to assume a discontinuous, islanded morphology by suitable annealing (see, for example, P. McCann et al. [("An investigation into interfacial oxide in direct silicon bonding," 6th Int. Symp. on Semiconductor Wafer Bonding, San Francisco, Sep. 2-7, 2001]). Wafer separation/removal after bonding may be accomplished by grinding or etching the wafer away (preferably making use of an etch stop layer), or by making use of a mechanically weak interface layer created at earlier steps in processing. Examples of mechanically weak interface layers include porous Si (see, for example, Epitaxial Layer Transfer (ELTRAN) described by K. Sakaguchi et al. in Solid State Technology, June 2000] and ion-implanted H-containing bubbles (see, for example, Smart Cut process, described in U.S. Pat. No. 5,374,564 by M. Bruel, which issued Dec. 20, 1994, and U.S. Pat. No. 5,882,987 by K. V. Srikrishnan, which issued Mar. 16, 1999).

Amorphization would typically be effected by ion implantation. The optimum ion implantation conditions will depend on the materials of the template layers, the thickness of the template layers, and position (upper or lower) of the stack layer being amorphized. Any ion species known to those skilled in the art may be used, including but not limited to: Si, Ge, Ar, C, O, N, H, He, Kr, Xe, P, B, As, etc. Ions for the amorphization are preferably Si or Ge. Lighter ions such as H and He are typically less effective at amorphization. Ion implantation may be performed at temperatures ranging from cryogenic to several hundred ° C. above nominal room temperature. By "nominal room temperature" it is meant a temperature from about 20° to about 40° C. Regions not being amorphized would typically be protected from ion implantation by a patterned mask (for example, patterned photoresist for a room temperature implantation process). Implants may be performed with or without "screen oxide" layers and may be performed with multiple implants at different energies if a sufficiently uniformly amorphized region cannot be easily achieved with a single implant. The required implant dose depends on the implanting species, the semiconductor being implanted, and the thickness of the layer needing to be amorphized. Si implanted at cryogenic temperatures at 50, 100, 150, and 200 keV with a total dose of $6E15/cm^2$ was found to be sufficient to amorphize the top 400 nm of 100-oriented and 110-oriented Si (see, for example, L. Csepregi et al.). However, much lower doses (for example, $5E14/cm^2$ at 40 keV) can amorphize Si when the implanted ion is Ge and surface region to be amorphized is thinner than 50-100 nm.

Recrystallization of localized amorphous regions 630, 730, and 850 is typically effected by annealing at temperatures from about 200° to about 1300° C., preferably from about 400° to about 900° C., and more preferably from about 400° and 600° C., for a time period sufficient to bring about the desired recrystallization. This time period will depend on the orientation of the template layer, on the thickness of the amorphized region to be recrystallized, on the presence of implanted and other impurities in the amorphized layer, and possibly on the sharpness of the interface between the implanted and unimplanted regions. Annealing may be performed in a furnace or by rapid thermal annealing. In other embodiments, annealing may be performed using a laser anneal or a spike anneal. The annealing ambient would typically be selected from the group of gases including $N_2$, Ar, He, $H_2$ and mixtures of these gases.

When a buried insulating is created in the structure following the recrystallizing step, any conventional ion implant step and annealing step that can be used in forming a buried insulating layer can be employed. For example, any conventional SIMOX process can be used in producing a buried oxide layer in the structures shown in FIGS. 8F-8G.

Several embodiments of the present invention, together with modifications thereof, have been described in detail herein and illustrated in the accompanying drawings, it will be evident that various further modifications are possible without departing from the scope of the invention. In particular, it should be emphasized that while most of the substrate structures, circuits, and methods of this invention have been illustrated for the case of a small number of single crystal regions having two different orientations, the invention applies equally well to methods for providing and structures comprising large pluralities of such single crystal regions. Furthermore, the hybrid-orientation substrates of the invention may incorporate additional overlayers (such as epitaxially grown semiconductors or additional bonded layers), removal or etchback of certain surface features (for example, recessing one or more of the single crystal semiconductor regions or trench isolations), and/or specialized doping profiles, if such substrate features are desired for the subsequently fabricated devices. Nothing in the above specification is intended to limit the invention more narrowly than the appended claims. The examples given are intended only to be illustrative rather than exclusive.

What is claimed is:

1. A method of forming a planar hybrid-orientation substrate comprising:

forming a bilayer template layer stack comprising a first, lower single crystal semiconductor layer having a first crystallographic orientation and a second, upper single crystal semiconductor layer having a second crystallographic orientation different from the first crystallographic orientation, said first, lower single crystal semiconductor layer has a bottom surface in direct contact with a buried insulator;

amorphizing a portion of said first, lower single crystal semiconductor layer and a portion of said second, upper single crystal semiconductor layer in selected areas to form a localized amorphized region, wherein said localized amorphized region has a bottom surface in direct contact with an upper surface of said buried insulator and an upper surface that is located beneath an upper surface of said second, upper single crystal semiconductor layer; and recrystallizing the localized amorphized regions using a non-amorphized semiconductor portion of the second, upper single crystal semiconductor layer as a template, thereby changing the crystallographic orientation in the localized amorphized regions from an original crystallographic orientation to a desired crystallographic orientation, wherein the recrystallized region and the first, lower single crystal semiconductor layer each have a different crystallographic orientation and each have bottom surfaces that are disposed directly on said surface of said buried insulator.

2. A method of forming a planar hybrid-orientation substrate comprising:

forming a bilayer template layer stack comprising, from bottom to top, a first, lower single crystal semiconductor layer having a first crystallographic orientation and a second, upper single crystal semiconductor layer having a second crystallographic orientation different from said first crystallographic orientation;

amorphizing a portion of said bilayer template stack in at least one selected area to form a buried localized amorphized region by implanting ions through a portion of a top surface of said second, upper single crystal semiconductor layer, wherein said buried localized amorphized region includes a first localized amorphized region and a second localized amorphized region, said first localized amorphized region is located above a plane of an interface at which a top surface of a non-amorphized portion of said first, lower single crystal semiconductor layer contacts a bottom surface of a non-amorphized portion of said second, upper single crystal layer, and said second localized amorphized region is located below said plane of said interface, wherein said buried localized amorphized region is vertically separated from an exposed top surface of said non-amorphized portion of said second, upper single crystal layer; and recrystallizing said buried localized amorphized region using said non-amorphized portion of said second, upper single crystal semiconductor layer of said bilayer template layer stack as a template, thereby converting said buried localized amorphized region into a recrystallized single crystal semiconductor portion having said second crystallographic orientation, wherein an entirety of said bilayer template layer above said plane of said interface has said second orientation after said recrystallizing, and a portion of said bilayer template layer below said plane of said interface includes said non-amorphized portion of said first, lower single crystal semiconductor layer having said first crystallographic orientation and a portion of said recrystallized single crystal semiconductor portion having said second crystallographic orientation after said recrystallizing, and wherein a lower surface of said recrystallized single crystal semiconductor portion having said second crystallographic orientation and a lower surface of said first, lower single crystal semiconductor layer having said first crystallographic orientation are disposed directly on a common buried insulator.

3. The method of claim 2 wherein said first, lower single crystal semiconductor layer comprises a single crystal semiconductor substrate.

4. The method of claim 2 wherein said bilayer template layer stack is formed by bonding said second, upper single crystal semiconductor layer with said first, lower single crystal semiconductor, wherein said second, upper single crystal semiconductor layer is placed directly atop said first, lower single crystal semiconductor.

5. The method of claim 2 wherein said localized amorphized region is formed predominately within the first, lower single crystal semiconductor layer.

6. The method of claim 1 wherein said localized amorphized region is formed predominately within the first, lower single crystal semiconductor layer, and said method further includes removing said entirety of said bilayer template layer stack above said plane of said interface after said recrystallization.

7. The method of claim 2 further comprising forming at least one trench isolation region to separate said at least one selected area from at least another that is not selected for amorphization, said at least one trench isolation being formed prior to amorphizing, between amorphizing and recrystallizing, or partially after amorphizing and partially after recrystallizing.

8. The method of claim 2 wherein said first, lower single crystal semiconductor and layer said second, upper single crystal semiconductor layer are composed of the same or different semiconductor material selected from the group consisting of Si, SiC, SiGe, SiGeC, Ge alloys, Ge, C, GaAs, InAs, InP, layered combinations or alloys thereof, and other III-V or II-VI compound semiconductors.

9. The method of claim 2 wherein said first, lower single crystal semiconductor layer and said second, upper single crystal semiconductor layer are both composed of a Si-containing semiconductor material.

10. The method of claim 2 wherein said first, lower single crystal semiconductor layer and said second, upper single crystal semiconductor layer are composed of strained, unstrained or a combination of strained and unstrained semiconductor materials.

11. The method of claim 2 wherein said first, lower single crystal semiconductor layer and said second, upper single crystal semiconductor layer have different surface orientations selected from (110), (111) and (100).

12. The method of claim 2 further comprising forming at least one nFET device and at least one pFET device on each of said non-amorphized portion of said first, lower single crystal semiconductor layer and said portion of said recrystallized single crystal semiconductor portion, wherein said at least one nFET device is located on a crystal orientation that is optimal for said device said at least pFET device is located on a crystal orientation that is optimal for said device.

13. The method of claim 3 further comprising forming a buried insulating layer after said recrystallizing step.

14. The method of claim 13 wherein said buried insulating layer is formed by a separation-by-ion implantation of oxygen (SIMOX) process.

15. The method of claim 2 wherein said amorphizing is accomplished by ion implantation.

16. The method of claim 15 wherein said ion implantation comprises an ion selected from the group consisting of Si, Ge, Ar, C, O, N, H, He, Kr, Xe, P, B and As.

17. The method of claim 15 wherein said ion implantation comprising an ion selected from the group consisting of Si and Ge.

18. The method of claim 2 wherein said recrystallizing is performed at a temperature from about 200° C. to about 1300° C.

19. The method of claim 2 wherein said recrystallizing is performed in a gas selected from the group consisting of $N_2$, Ar, He, $H_2$ and mixtures thereof.

20. The method of claim 2 wherein said at least one single crystalline portion having said first orientation laterally abuts said at least a recrystallized portion having said second orientation after said recrystallizing.

21. The method of claim 2 further comprising:
    removing said second, upper single crystal semiconductor layer; and
exposing a top surface of said at least one single crystalline portion having said first orientation and a top surface of said at least a recrystallized portion having said second orientation.

* * * * *